United States Patent
Sanderfer et al.

(10) Patent No.: US 6,274,504 B2
(45) Date of Patent: *Aug. 14, 2001

(54) MINIMIZING METAL CORROSION DURING POST METAL SOLVENT CLEAN

(75) Inventors: Anne E. Sanderfer, Campbell; Jacques Bertrand, Capitola, both of CA (US)

(73) Assignee: Advanced Micro Devices, Inc., Sunnyvale, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/334,120

(22) Filed: Jun. 15, 1999

(51) Int. Cl.$^7$ .................. H01L 21/302; H01L 21/461
(52) U.S. Cl. .................. 438/745; 438/749; 438/750; 134/1.2; 134/1.3
(58) Field of Search .................. 438/745, 749, 438/750, 753, 754; 134/1.2, 1.3, 32, 33, 18

(56) References Cited

U.S. PATENT DOCUMENTS

| | | | | |
|---|---|---|---|---|
| 4,119,550 | * | 10/1978 | Davis et al. ..................... | 252/45 |
| 4,261,791 | * | 4/1981 | Shwartzman ..................... | 156/628 |
| 5,419,779 | | 5/1995 | Ward . | |
| 5,792,274 | * | 8/1998 | Tanabe et al. ..................... | 134/1.3 |
| 5,863,348 | * | 1/1999 | Smith, Jr. et al. ..................... | 134/18 |
| 6,033,993 | * | 3/2000 | Love, Jr. et al. ..................... | 438/745 |
| 6,068,000 | * | 5/2000 | Tanabe et al. ..................... | 438/750 |

OTHER PUBLICATIONS

Advanced Chemical Technologies New Product Bulletin entitled Sidewall Polymer Positive Phtoresist Remover.
CRC Handbook of Chemistry and Physics 80$^{th}$ Edition (p. 3–305).
Microchip Fabrication—Third Edition, Peter Van Zant (pp. 276 and 283).
Silicon Processing for the VLSI Era vol. 1 Process Technology 2$^{nd}$ Edition, Stanley Wolf Ph.D. & Richard N. Tauber Ph.D. (pp. 131 and 133).

* cited by examiner

*Primary Examiner*—Robert Kunemund
*Assistant Examiner*—Duy-Vu Deo
(74) *Attorney, Agent, or Firm*—LaRiviere, Grubman & Payne, LLP

(57) ABSTRACT

The inventive method provides a wet cleaning of semiconductor devices on semiconductor wafers after photoresist is stripped. Semiconductor wafers are placed into a centrifuge carriage of a processing chamber. The centrifuge carriage rotates the semiconductor wafers. N-methylpyrrolidine heated to a temperature between 65° C. and 85° C. is sprayed onto the semiconductor wafers. Next N-methylpyrrolidine at room temperature is sprayed onto the semiconductor wafers. Finally, water at room temperature is sprayed onto the semiconductor wafers. The inventive method provides high throughput cleaning without undue corrosion or damage to metal layers.

6 Claims, 4 Drawing Sheets

MINIMIZING METAL CORROSION DURING POST METAL SOLVENT CLEAN

FIELD OF THE INVENTION

The present invention relates the cleaning of etched residue from semiconductor devices. More particularly, the invention relates to the wet cleaning of etched residue from semiconductor devices.

BACKGROUND OF THE INVENTION

In the manufacture of semiconductor devices, photoresist is applied to a surface to create an etch barrier. Parts not covered by the photoresist are etched away. The photoresist is then stripped away. Remaining photoresist and the etching residue is then cleaned, often through a wet cleaning process. If the solvent used in the wet cleaning process is too aggressive, the solvent may attack or corrode metal layers of the semiconductor devices. If the solvent used in the wet cleaning process is not aggressive enough, it may provide a slow throughput or insufficient residue removal. As device size decreases, solvent attack or corrosion of metal layers and residue are more likely to damage a semiconductor device.

It would be advantageous to provide a wet cleaning processes that reduces solvent attack and corrosion of metal layers, which does not reduce residue removal and device throughput.

BRIEF SUMMARY OF THE INVENTION

It is an object of the invention to provide a wet cleaning process that reduces solvent attack and corrosion of metal layers, without reducing residue removal and device throughput.

Accordingly, the foregoing object is accomplished providing a solvent spray at an elevated temperature, then providing a spray of the same solvent at a lower temperature close to room temperature, and then providing a water rinse.

Other features of the present invention are disclosed or apparent in the section entitled: "DETAILED DESCRIPTION OF THE INVENTION."

BRIEF DESCRIPTION OF DRAWINGS

For a fuller understanding of the present invention, reference is made to the accompanying drawings wherein.

Figure 1:
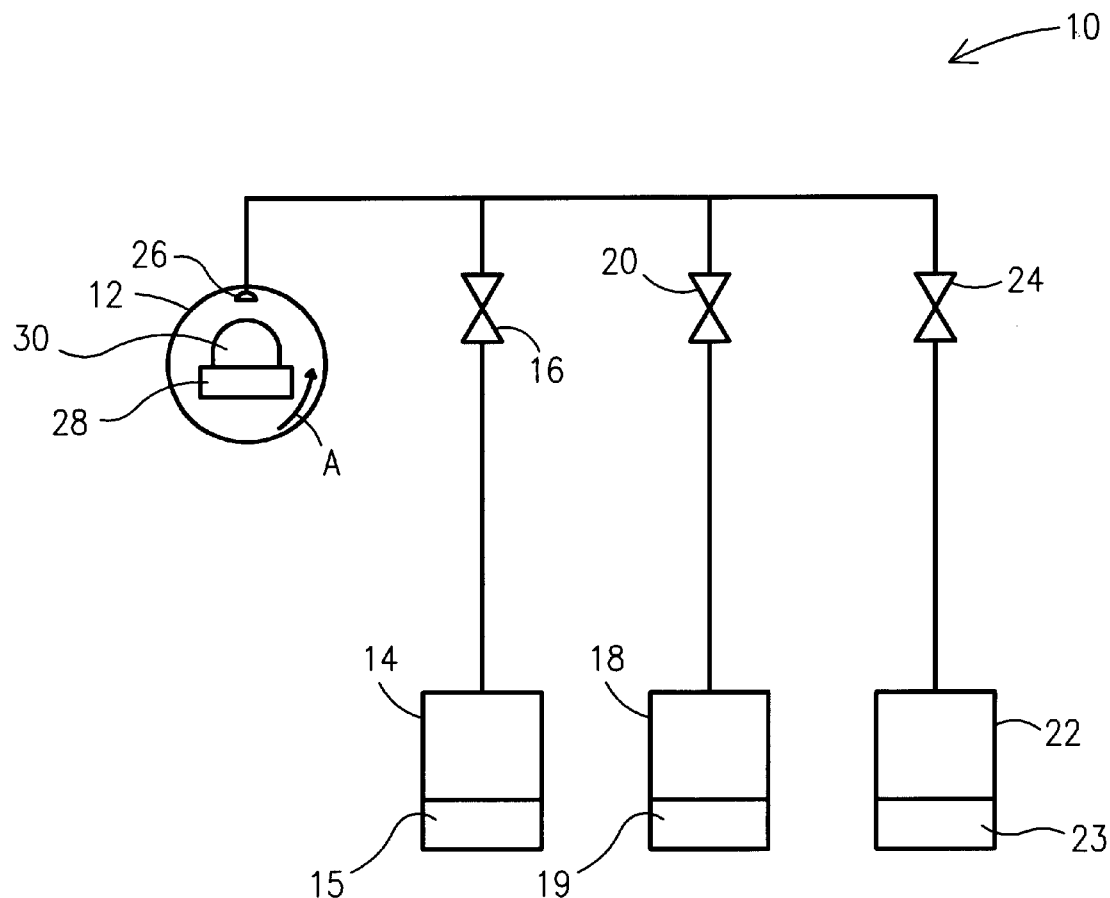
FIG. 1 is a schematic view of a wafer cleaning rinse system that is used in the practice of the invention.

Reference numbers refer to the same or equivalent parts of the present invention throughout the several figures of the drawing.

DETAILED DESCRIPTION OF THE INVENTION AND BEST MODE OF THE INVENTION

FIG. 1 is a schematic view of a wafer cleaning system 10. The wafer cleaning system 10 comprises a processing chamber 12, a first tank 14 in fluid connection with the processing chamber 12 through a first valve 16, a second tank 18 in fluid connection with the processing chamber 12 through a second valve 20, and a third tank 22 in fluid connection with the processing chamber 12 through a third valve 24. A first temperature control 15 is connected to the first tank 14. A second temperature control 19 is connected to the second tank 18. A third temperature control 23 is connected to the third tank 22. The processing chamber 12 comprises at least one spray nozzle 26 and a centrifuge carriage 28.

Figure 2:
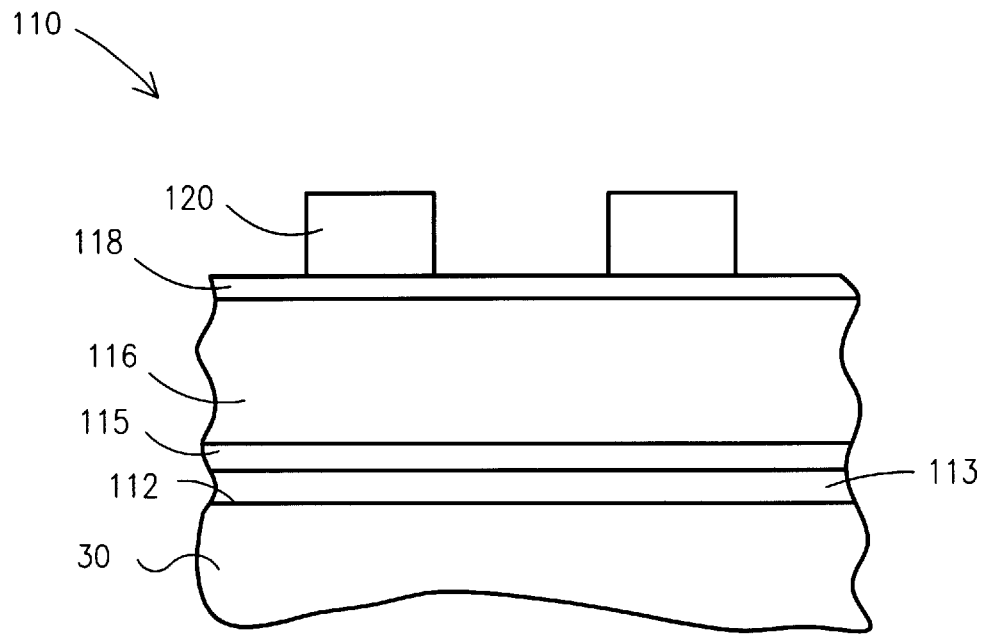
FIG. 2 is a cross-sectional view of an unfinished semiconductor device prior to being etched.

In operation, prior to the inventive cleaning step, a wafer undergoes several steps to build semiconductor devices. FIG. 2 is a cross-sectional view of an unfinished semiconductor device 110 on a semiconductor wafer 30, which has an upper surface 112. An oxide layer 113 is deposited on the upper surface 112. A first refractory metal layer 115 is deposited on the oxide layer 113. In this example, the first refractory metal layer 115 is made of a refractory material chosen from the group consisting of titanium Ti, titanium nitride TiN, titanium/titanium nitride Ti/TiN. An aluminum alloy layer 116 is deposited on the first refractory material layer 115. A second refractory metal layer 118 is deposited on the aluminum alloy layer 116. In this example, the second refractory material layer is made of a refractory material chosen from the group consisting of Ti, TiN, Ti/TiN. A photoresist mask 120 is placed on the second refractory material layer 118.

The semiconductor device 110 then is subjected to a plasma etching to provide a metal etch. In plasma etching a power source creates a radio frequency field, which is used to energize etchant gases to a plasma state. The etchant gases attack the metal layer etching away the parts of the first refractory material layer 115, aluminum alloy layer 116, second refractory material layer 118, and the oxide layer 112 that are not covered by the photoresist mask 120.

Figure 3:
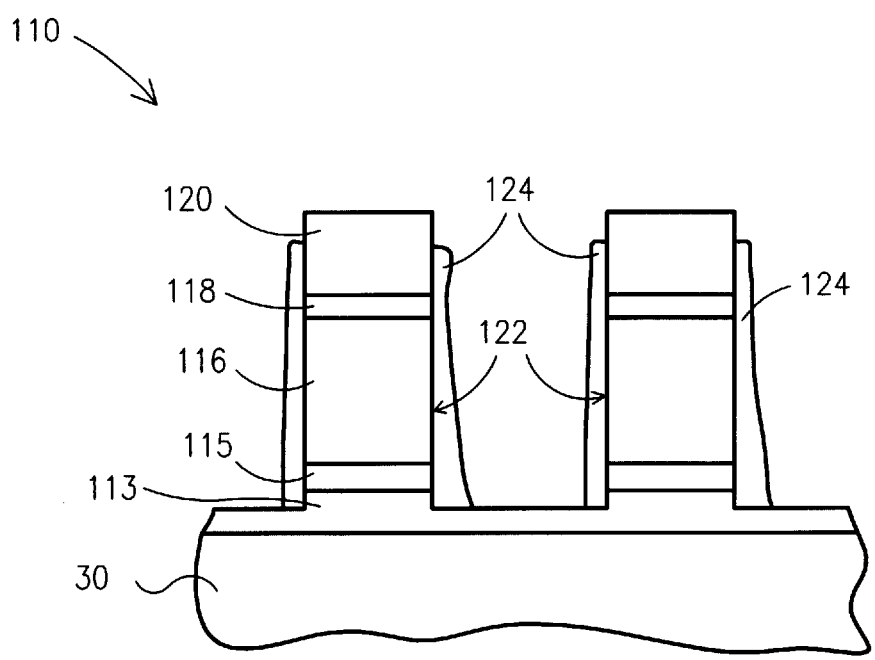
FIG. 3 is a cross-sectional view of the unfinished semiconductor device, shown in FIG. 2, after etching.

FIG. 3 is a cross sectional view of the part of the unfinished semiconductor device 110 after it has gone through the metal etch. Two stacks 122 are formed with each stack comprising an oxide layer 113, a first refractory material layer 115, an aluminum alloy layer 116, and a second refractory material layer 118, capped by the photoresist mask 120. The etchant gasses deposit some of the photoresist onto the side walls of the stacks 122, creating sidewall polymer residue 124.

Figure 4:
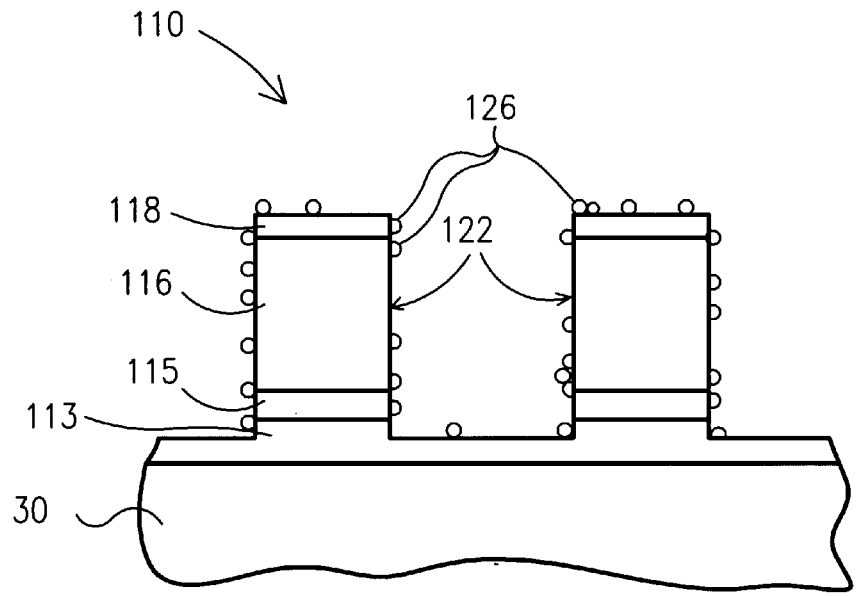
FIG. 4 is a cross-sectional view of the unfinished semiconductor device, shown in FIG. 3, after plasma stripping and solvent stripping and prior to the inventive process.

The semiconductor device 110 is then subjected to a plasma strip and then a solvent strip which strips away the sidewall polymer residue 124 and the photoresist mask 120, but leaves a polymer residue 126 as schematically illustrated in FIG. 4.

The wafer 30 is then mounted in the centrifuge carriage 28, as shown in FIG. 1. The centrifuge carriage 28 rotates the wafer 30 in the direction indicated by arrow A. The first temperature control 15 heats a solvent in the first tank 14 to a temperature of between 50° C. and 100° C. In the preferred embodiment, the solvent is a N-methylpyrrolidine (NMP) based solvent heated to a temperature of between 65° C. and 85° C. The first valve 16 is opened and allows the NMP solvent from the first tank to go to the spray nozzle 26, which sprays the NMP solvent into the processing chamber 12 and onto the rotating wafer 30. After a period of time, the first valve 16 is closed, which discontinues the spraying of the NMP solvent from the first tank 14 into the processing chamber 12.

The second temperature control 19 maintains the solvent in the second tank 18 at a temperature of between 20° C. and 40° C. The solvent in the second tank 18 is the same chemical as the solvent in the first tank 14, which in the preferred embodiment the solvent is a N-methylpyrrolidine (NMP) based solvent, but is maintained at a different temperature, which in the preferred embodiment is between 25° C. and 30° C. The second valve 20 is opened and allows the NMP solvent from the second tank 18 to go to the spray nozzle 26, which sprays the NMP solvent into the processing chamber 12 and onto the rotating wafer 30. After a period of time, the second valve 20 is closed, which discontinues the spraying of the NMP solvent from the second tank 18 into the processing chamber 12. Since room temperature is within the temperature range of the solvent in the second tank 18, the second temperature control 19 may not need to heat the solvent in the second tank 18. Therefore, the invention may be practiced without the second temperature control 19. It is also possible that the second temperature control 19 may need to cool the solvent in the second tank 18 to keep the solvent at room temperature.

The third temperature control 23 maintains water, which is contained in the third tank 22, at a temperature of between 20° C. and 40° C. The water is preferably kept at room temperature. The third valve 24 is opened and allows the water from the third tank 22 to go to the spray nozzle 26, which sprays the water into the processing chamber 12 and onto the rotating wafer 30. After a period of time, the third valve 20 is closed, which discontinues the spraying of the water from the third tank 22 into the processing chamber 12. Since the water is preferably at room temperature, the third temperature control 23 may not need to heat the water in the third tank 22. Therefore, the invention may be practiced without the third temperature control 23. It is also possible that the third temperature control 23 may need to cool the water in the third tank 22 to keep the water at room temperature.

The centrifuge carriage 28 stops rotating the wafer 30. The wafer 30 is removed from the centrifuge carriage 28. In the preferred embodiment, more than one wafer 30 is held in the centrifuge carriage 28 at a time.

Figure 5:
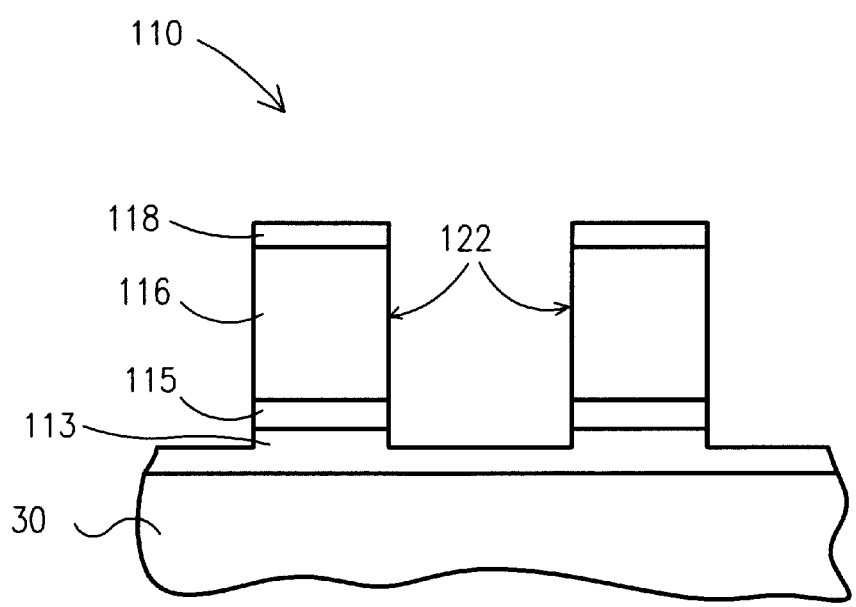
FIG. 5 is a cross-sectional view of the unfinished semiconductor device, shown in FIG. 4, after undergoing the inventive process.

FIG. 5 is a cross sectional-view of the part of the unfinished semiconductor device 110 after it has been removed from the centrifuge carriage 28. The polymer residue 126 has been stripped from the stacks 122. The inventive method is aggressive enough to provide a fast throughput, but reduces solvent attack and corrosion of the first refractory material layer 115, an aluminum alloy layer 116, and a second refractory material layer 118.

Figure 6:
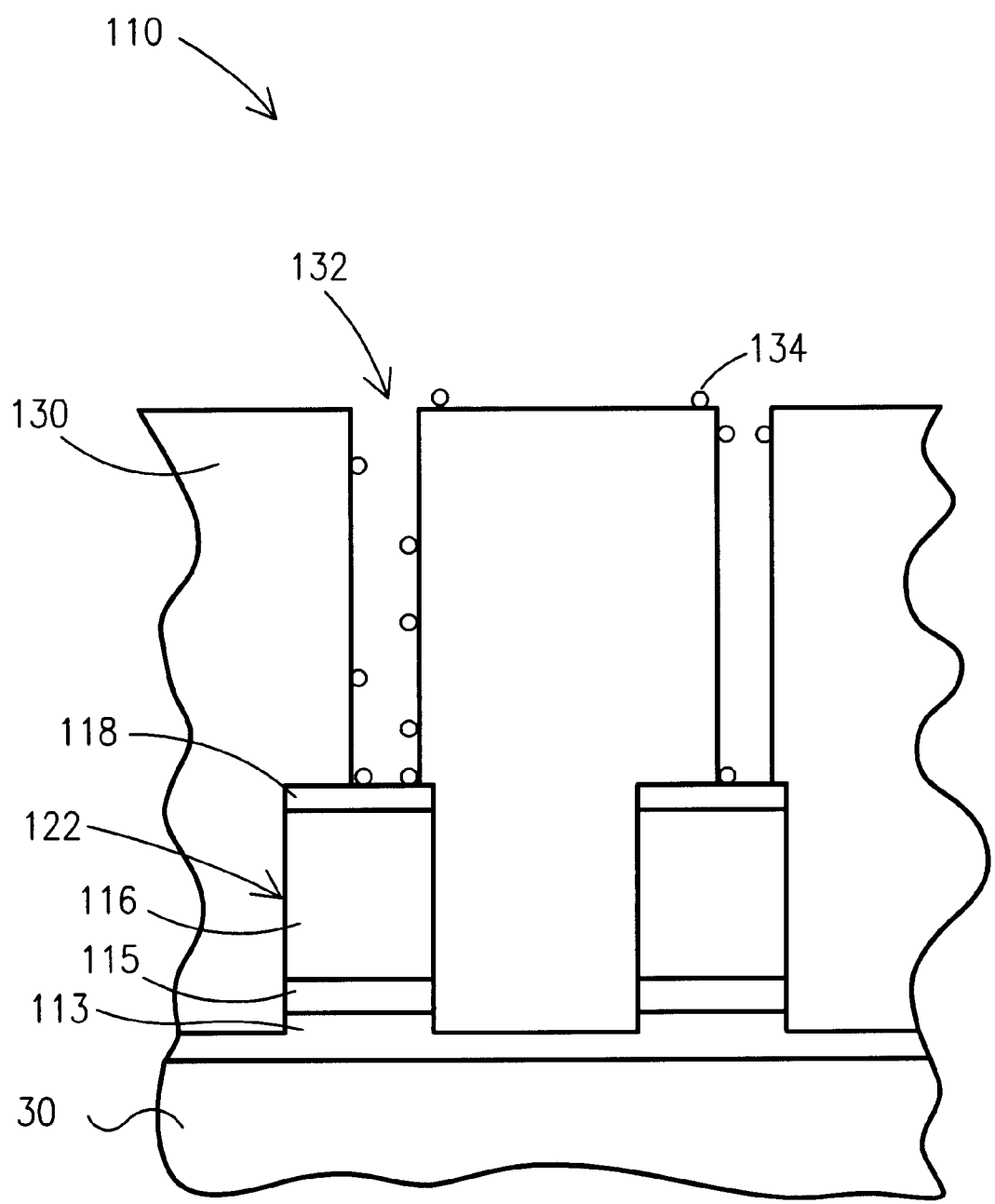
FIG. 6 is a cross-sectional view of the of the unfinished semiconductor device, shown in FIG. 5, after an intermetallic dielectric layer has been deposited over the stacks.

FIG. 6 is a cross-sectional view of the part of the unfinished semiconductor device 110 after an intermetallic dielectric layer 130 has been deposited over the stacks 122. Vias 132 have been etched in the intermetallic dielectric layer 130 to the stacks 122, using a photoresist process. After the photoresist has been stripped, a polymer residue 134 remains. The wafer 30 is placed into the centrifuge carriage 28 as shown in FIG. 1, and the clean process described above is repeated. Namely, the centrifuge carriage 28 rotates the wafer 30 in the direction indicated by arrow A. The first temperature control 15 heats a solvent in the first tank 14 to a temperature of between 50° C. and 100° C. In the preferred embodiment the solvent is a N-methylpyrrolidine (NMP) based solvent heated to a temperature of between 65° C. and 85° C. The first valve 16 is opened and allows the NMP solvent from the first tank to go to the spray nozzle 26, which sprays the NMP solvent into the processing chamber 12 and onto the rotating wafer 30. After a period of time, the first valve 16 is closed, which discontinues the spraying of the NMP solvent from the first tank 14 into the processing chamber 12.

The second temperature control 19 maintains the solvent in the second tank 18 at a temperature of between 20° C. and 40° C. The solvent in the second tank 18 is the same chemical as the solvent in the first tank 14, which in the preferred embodiment the solvent is a N-methylpyrrolidine (NMP) based solvent, but is maintained at a different temperature, which in the preferred embodiment is between 25° C. and 30° C. The second valve 20 is opened and allows the NMP solvent from the second tank 18 to go to the spray nozzle 26, which sprays the NMP solvent into the processing chamber 12 and onto the rotating wafer 30. After a period of time, the second valve 20 is closed, which discontinues the spraying of the NMP solvent from the second tank 18 into the processing chamber 12. Since room temperature is within the temperature range of the solvent in the second tank 18, the second temperature control 19 may not need to heat the solvent in the second tank 18.

The third temperature control 23 maintains water which is contained in the third tank 22 at a temperature of between 20° C. and 40° C. The water is preferably kept at room temperature. The third valve 24 is opened and allows the water from the third tank 22 to go to the spray nozzle 26, which sprays the water into the processing chamber 12 and onto the rotating wafer 30. After a period of time, the third valve 20 is closed, which discontinues the spraying of the water from the third tank 22 into the processing chamber 12. Since the water is preferably at room temperature, the third temperature control 23 may not need to heat the water in the third tank 22.

The centrifuge carriage 28 stops rotating the wafer 30. The wafer 30 is removed from the centrifuge carriage 28. In the preferred embodiment, more than one wafer 30 is held in the centrifuge carriage 28 at a time.

The cleaning system 10 removes the polymer residue 134 from the vias 132. The inventive method is aggressive enough to provide a fast throughput, but reduces solvent attack and corrosion of the second refractory material layer 118, which is exposed to the solvent through the vias 132. Therefore the inventive polymer residue cleaning process may be used to protect metal layers in both the production of stacks and in the creation of vias.

The unfinished semiconductor device undergoes further processes known in the prior art to complete the semiconductor device.

Information as herein shown and described in detail is fully capable of attaining the above-described object of the invention, it is understood that it is the presently preferred embodiment of the present invention and is thus representative of the subject matter which is broadly contemplated by the present invention, that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more". All structural and functional equivalents to the elements of the above-described preferred embodiment that are known or later come to be known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims. No claim element herein is to be construed under the provisions of 35 U.S.C. 112, sixth paragraph, unless the element is expressly recited using the phrase "means for".

We claim:

1. A method of cleaning residual photoresist from a semiconductor wafer, comprising the steps of:

providing said semiconductor wafer having a quantity of residual photoresist thereon deposited;

placing the semiconductor wafer into a processing chamber;

spraying a first solvent, comprising N-methylpyrrolidine, maintained in a temperature range of 65° C. to 100° C., onto the semiconductor wafer;

discontinuing the spraying of the first solvent onto the semiconductor wafer;

spraying a second solvent comprising N-methylpyrrolidine, maintained in a temperature range of 20° C. to 40° C., onto the semiconductor wafer;

discontinuing the spraying of the second solvent onto the semiconductor wafer;

spraying water, maintained in a temperature range of 20° C. to 40° C., onto the semiconductor wafer; and discontinuing the spraying of the water onto the semiconductor wafer.

2. The method, as recited in claim 1, wherein the step of: spraying water onto the semiconductor substrate is performed at a temperature of approximately 20° C.

3. The method, as recited in claim 2, wherein each of said steps of spraying the first solvent onto the wafer, spraying the second solvent onto the wafer, and spraying the water onto the wafer further comprise the step of centrifuging the wafer.

4. The method, as recited in claim 3, wherein the step of spraying the first solvent onto the wafer, the first solvent is maintained in a temperature range of 65° C. to 85° C.

5. The method, as recited in claim 4, wherein the step of spraying the second solvent onto the wafer, the second solvent is maintained in a temperature range of 25° C. to 30° C.

6. A method of cleaning residual photoresist from a semiconductor wafer, comprising the steps of:

providing said semiconductor wafer having a quantity of residual photoresist thereon deposited;

placing the semiconductor wafer into a centrifuge within a processing chamber and spinning the wafer;

spraying a first solvent, comprising N-methylpyrrolidine, maintained at a temperature near the boiling point, onto the spinning semiconductor wafer;

discontinuing the spraying of the first solvent onto the semiconductor wafer;

spraying a second solvent comprising N-methylpyrrolidine, maintained at a temperature of approximately 20° C., onto the spinning semiconductor wafer;

discontinuing the spraying of the second solvent onto the semiconductor wafer;

spraying water, maintained in a temperature range of 20° C. to 40° C., onto the spinning semiconductor wafer; and discontinuing the spraying of the water onto the semiconductor wafer.

* * * * *